United States Patent [19]  [11] Patent Number: 4,737,235
Scannell  [45] Date of Patent: Apr. 12, 1988

[54] PROCESS FOR POLYSILICON WITH FREON 11 AND ANOTHER GAS

[75] Inventor: Jack W. Scannell, Phoenix, Ariz.

[73] Assignee: Tegal Corporation, Navato, Calif.

[21] Appl. No.: 931,006

[22] Filed: Nov. 17, 1986

Related U.S. Application Data

[63] Continuation of Ser. No. 656,200, Oct. 1, 1984, abandoned.

[51] Int. Cl.[4] .......................................... H01L 21/306
[52] U.S. Cl. .................................... 156/643; 156/646; 156/657; 156/659.1; 156/662; 204/192.32; 252/79.1
[58] Field of Search ............... 156/643, 646, 657, 662, 156/345, 659.1; 204/192.32, 192.37; 252/79.1; 137/210, 216, 7, 88

[56] References Cited

U.S. PATENT DOCUMENTS

| | | | |
|---|---|---|---|
| 4,214,946 | 7/1980 | Forget et al. | 156/643 |
| 4,255,230 | 3/1981 | Zajac | 156/646 X |
| 4,345,610 | 8/1982 | Herter et al. | 137/7 |
| 4,353,777 | 10/1982 | Jacob | 252/79.1 X |
| 4,442,338 | 4/1984 | Yamazaki | 156/345 X |
| 4,447,290 | 5/1984 | Matthews | 204/192 E X |
| 4,472,237 | 9/1984 | Deslauriers et al. | 156/657 X |
| 4,473,435 | 9/1984 | Zafiropoulo et al. | 156/662 X |

Primary Examiner—Donald E. Czaja
Assistant Examiner—Ramon R. Hach
Attorney, Agent, or Firm—Paul F. Wille

[57] ABSTRACT

A process for etching polysilicon is provided wherein $CFCl_3$ (Freon 11) and another gas, typically $SF_6$, is pre-mixed in a storage chamber before routing to an etching chamber. This process prevents condensation of the Freon 11 in a routing line and resultant failure of a mass flow controller due to liquid ingestion. Furthermore, since the gases are pre-mixed and only one mass flow controller is used, the accuracy of the mixture is not dependent on the precision of the mass flow controller.

4 Claims, 1 Drawing Sheet

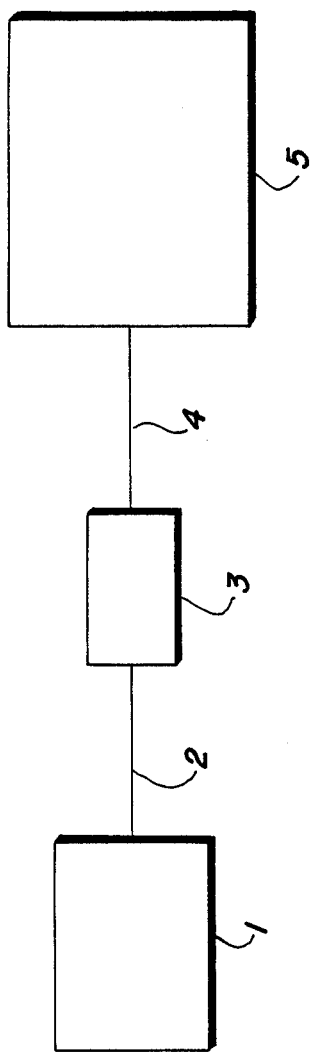

PROCESS FOR POLYSILICON WITH FREON 11 AND ANOTHER GAS

This application is a continuation of application Ser. No. 656,200 filed Oct. 1, 1984, now abandoned.

BACKGROUND OF THE INVENTION

1. Field of the Invention

This invention relates generally to an improved process for etching polysilicon and, more particularly, to a process of pre-mixing $CFCl_3$ (Freon 11) and $SF_6$ for etching polysilicon.

2. Background Art

The manufacturing of semiconductor chips and related thin film circuitry involves the etching of different layers such as polysilicon and silicon. Typically, the area to be etched is masked by material such as photoresist with the mask forming a pattern of lines and areas exposing the layer to be etched. Earlier methods accomplished this etching by a wet chemical process using large amounts of various acids, alkalis, organic solvents and the like which contacted the exposed surface. However, many times this wet process resulted in contamination by impurities contained in the chemicals and swelling of the resist film used as a mask causing an irregular shape and occurrences of undercut. Undercutting occurs when the etchant acts horizontally as well as vertically, thereby removing material below the photoresist.

As technology advances and the trend toward miniaturization continues, an increased degree of integration requires more precise etching processes. More recent processes employ gas plasmas, particularly fluorine based gases selected from the saturated halocarbon series such as $CF_4$, $CCl_4$, and $BCl_3$. These gases are mixed with inert gases such as $O_2$, $N_2$, or Ar in a chamber in which the etching is to be accomplished.

One particular known process comprises the mixing of $CFCl_3$ (Freon 11) and $SF_6$ in the etching chamber which results in etched geometries with less than 0.3 micron total resist mask undercut. Freon 11 is stored in a tank in liquid form and remains a liquid at ambient temperatures, approximately 20° C., because its boiling point is 23.7° C. at one atmosphere pressure. As Freon 11 boils off creating a vapor, the vapor is removed along a line to a mass flow controller (MFC). The MFC precisely measures and provides for a predetermined flow of Freon 11 vapor to the etching chamber. The $SF_6$ is stored in a second tank in gas form and is also transported along a line to another MFC, wherein a predetermined flow is provided to the etching chamber. However, a temperature or pressure gradient along the line transporting the Freon 11 vapor may cause the vapor to condense into a liquid. This condensed liquid may enter the MFC, causing temporary or permanent failure due to liquid ingestion. Furthermore, it is possible for the liquid to accumulate causing a blockage in the line, thereby preventing any Freon 11 vapor from reaching the MFC. In either case, the end result is production yield loss, costly system downtime, and costly MFC replacement if damage is permanent. Attempts to eliminate the occurrence of this condensation by controlling the temperature of the line have not always been successful. Furthermore, the accuracy of the mix is dependent upon the correct operation of the two MFCs.

Thus, what is needed is an improved process for mixing Freon 11 and $SF_6$ that prevents failure of the process due to liquid forming in the vapor transportation lines, and where the accuracy of the percent mix of gases is independent of the MFCs.

SUMMARY OF THE INVENTION

Accordingly, it is an object of the present invention to provide an improved process for etching semiconductor materials.

Another object of the present invention is to provide an improved process for etching semiconductor materials with a mixture of Freon 11 and another gas wherein the Freon 11 vapor does not condense in the lines supplying the Freon 11 to the etching chamber.

Still another object of the present invention is to provide an improved process for etching semiconductor materials with a mixture of Freon 11 and another gas wherein the accuracy of the percent mix of the gases is independent of MFCs.

In carrying out the above and other objects of the invention in one form, there is provided a process for etching semiconductor material comprising the steps of mixing Freon 11 gas with a second gas and routing the mixed gases into an etching chamber.

The above and other objects, features, and advantages of the present invention will be better understood from the following detailed description.

BRIEF DESCRIPTION OF THE DRAWING

The single FIGURE is a block diagram illustrating an apparatus suitable for use in carrying out the inventive process.

DETAILED DESCRIPTION OF THE PREFERRED EMBODIMENT $SF_6$, as well as other fluorine based gases selected from the saturated halocarbon series, provides for a fast etch rate of semiconductor materials and provides for excellent selectivity of oxides (better etch rate of the primary material, i.e., polysilicon, to the secondary material, i.e., silicon dioxide). However, $SF_6$, when used alone, causes unacceptable undercut of the photoresist mask. Freon 11 has a slow etch rate but causes little undercut. When the $SF_6$ and Freon 11 are pre-mixed in accordance with the present invention, a sufficiently fast etch rate and selectivity are obtained while minimizing the undercut. A mixture of 12.0% of Freon 11 and 88.0% $SF_6$ provides good results; however, it is expected that a percent range for Freon 11 from 8.0% to 17.0% would provide beneficial results. This mixture precludes the condensation of the Freon 11 and the resultant failure of the MFC. Since the gases are pre-mixed, only one line and one MFC are required for supplying the mixture to the etch chamber. Therefore, the MFC has no bearing on the accuracy of the percent mix of the Freon 11 and $SF_6$.

Referring to the single FIGURE, storage chamber 1 is substantially evacuated and then filled with Freon 11 to a vapor pressure of 75.0%. At approximately twenty degrees centigrade, the absolute pressure of this Freon 11 is approximately 9.0 p.s.i. The remainder of storage chamber 1 is then filled with $SF_6$ to approximately 60.0 p.s.i. Once mixed, Freon 11 will not condense at room temperature.

The gas mixture flows through a line 2 to a single MFC 3 and then through line 4 to etching chamber 5. The gas mixture will not condense in the line or the MFC; therefore, there is no blockage of the line or failure of the MFC. Furthermore, since the gas is premixed and there is only one MFC, the accuracy of the percent mix of gases is independent of the MFCs.

Another embodiment comprises a two step etch process in with Freon 11 and $SF_6$, mixed as described above, is used first to etch the material. This mixture is then removed from the etching chamber and a mixture of Freon 11 and Argon is used for "overetching" the material. Storage chamber 1 is again filled with Freon 11 to a vapor pressure of 75.0%. The remainder of storage chamber 1 is then filled with Argon to approximately 20.0 p.s.i. Although other inert gases could be used, argon is desirable since it inhibits Freon 11 polymerization effects. A 39.0% mixture of Freon 11 in argon has proven satisfactory, although other percentages would work as well.

By mixing Freon 11 and the inert gas, condensation in the lines is prevented, thereby preventing blockage of the lines and failure of the MFC.

By now it should be appreciated that there has been provided an improved process of pre-mixing Freon 11 with another gas for etching polysilicon. This process prevents condensation of the Freon 11, thereby preventing blockage of the line and failure of the MFC. Furthermore, by pre-mixing the gases, the accuracy of the mix is not dependent upon the MFCs.

The above description is given by way of example only. Changes in form and details may be made by one skilled in the art without parting from the spirit and scope of the invention. For example, the pressure and percent of the gas mixtures may vary.

I claim:

1. A process for etching a semiconductor material comprising the steps of:
   storing $CFCl_3$ in a gaseous state at approximately 70° F. as a mixture with $SF_6$;
   supplying said gaseous mixture to a mass flow controller;
   supplying said gaseous mixture from the mass flow controller to a plasma reactor; and
   etching a semiconductor material using a plasma comprising said gaseous mixture.

2. The process according to claim 1 wherein the percent mixture of the $CFCl_3$ gas is in the range of 8.0 to 17.0 percent.

3. A process for etching a semiconductor material in a plasma reactor comprising the steps of:
   storing $CFCl_3$ in a gaseous state at approximately 70° F. as a mixture with $SF_6$;
   supplying said mixture to a mass flow controller;
   supplying said mixture to said reactor from said mass flow controller;
   etching said semiconductor material;
   terminating the flow of said mixture;
   storing $CFCl_3$ in a gaseous state at approximately room temperature as a second mixture, said second mixture including an inert gas;
   supplying said second mixture to a mass flow controller;
   supplying said second mixture to said reactor from the mass flow controller; and
   etching said semiconductor material with said second mixture.

4. A process for etching a semiconductor material comprising the steps of:
   storing $CFCl_3$ in a gaseous state at approximately 70° F. as a mixture with argon;
   supplying said gaseous mixture to a mass flow controller;
   supplying said gaseous mixture from the mass flow controller to a plasma reactor; and
   etching a semiconductor material using a plasma comprising said gaseous mixture.

* * * * *